(12) United States Patent
Veerasamy et al.

(10) Patent No.: US 7,445,273 B2
(45) Date of Patent: Nov. 4, 2008

(54) SCRATCH RESISTANT COATED GLASS ARTICLE RESISTANT FLUORIDE-BASED ETCHANT(S)

(75) Inventors: Vljayan S. Veerasamy, Ann Arbor, MI (US); Scott V. Thomsen, Milford, MI (US); Nestor P. Murphy, Monroe, MI (US); Rolf Hugo Petrmichl, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 85 days.

(21) Appl. No.: 10/899,305

(22) Filed: Jul. 27, 2004

(65) Prior Publication Data

US 2005/0129934 A1    Jun. 16, 2005

Related U.S. Application Data

(60) Provisional application No. 60/529,624, filed on Dec. 16, 2003, provisional application No. 60/529,103, filed on Dec. 15, 2003.

(51) Int. Cl.
*B32B 9/00* (2006.01)
*B60J 7/00* (2006.01)

(52) U.S. Cl. ............ 296/190.1; 296/146.1; 296/146.15; 296/200; 428/332; 428/408; 428/426; 428/432

(58) Field of Classification Search .................. 428/332, 428/408, 426, 432, 698, 699, 697, 701, 702; 296/146.1, 146.15, 190.1, 200
See application file for complete search history.

(56) References Cited

U.S. PATENT DOCUMENTS

| 4,336,119 A | 6/1982 | Gillery |
| 4,353,885 A | 10/1982 | Hoekje |
| 4,568,578 A | 2/1986 | Arfsten et al. |
| 5,122,252 A | 6/1992 | Latz et al. |
| 5,135,808 A | 8/1992 | Kimock et al. |
| 5,268,217 A | 12/1993 | Kimock et al. |
| 5,594,231 A * | 1/1997 | Pellicori et al. ............. 428/408 |
| 5,635,245 A | 6/1997 | Kimock et al. |

(Continued)

FOREIGN PATENT DOCUMENTS

EP    0 636 702    2/1995

(Continued)

OTHER PUBLICATIONS

U.S. Appl. No. 60/529,624, filed Dec. 16, 2003.

(Continued)

*Primary Examiner*—Archene Turner
(74) *Attorney, Agent, or Firm*—Nixon & Vanderhye P.C.

(57) ABSTRACT

A scratch resistant coated article is provided which is also resistant to attacks by at least some fluoride-based etchant(s) for at least a period of time. In certain example embodiments, an anti-etch layer(s) is provided on the glass substrate in order to protect the glass substrate from attacks by fluoride-based etchant(s). In certain example embodiments, the anti-etch layer(s) is substantially transparent to visible light. In certain embodiments, a DLC layer(s) may be provided over the anti-etch layer. An underlayer may be provided under the anti-etch layer(s) in certain example embodiments.

10 Claims, 5 Drawing Sheets

U.S. PATENT DOCUMENTS

| | | |
|---|---|---|
| 5,679,413 A | 10/1997 | Petrmichl et al. |
| 5,888,593 A | 3/1999 | Petrmichl et al. |
| 5,935,735 A | 8/1999 | Okubo et al. |
| 6,002,208 A | 12/1999 | Maishev et al. |
| 6,077,569 A | 6/2000 | Knapp et al. |
| 6,254,796 B1 | 7/2001 | Rath et al. |
| 6,261,693 B1 | 7/2001 | Veerasamy |
| 6,280,834 B1 | 8/2001 | Veerasamy et al. |
| 6,284,377 B1 | 9/2001 | Veerasamy |
| 6,291,054 B1 | 9/2001 | Thomas et al. |
| 6,303,225 B1 | 10/2001 | Veerasamy |
| 6,303,226 B2 | 10/2001 | Veerasamy |
| 6,335,086 B1 | 1/2002 | Veerasamy |
| 6,338,901 B1 | 1/2002 | Veerasamy |
| 6,359,388 B1 | 3/2002 | Petrmichl |
| 6,368,664 B1 | 4/2002 | Veerasamy et al. |
| 6,395,333 B2 | 5/2002 | Veerasamy |
| 6,447,891 B1 | 9/2002 | Veerasamy et al. |
| 6,461,731 B1 | 10/2002 | Veerassamy et al. |
| 6,475,573 B1 | 11/2002 | Veerasamy et al. |
| 6,592,992 B2 | 7/2003 | Veerasamy |
| 6,592,993 B2 | 7/2003 | Veerasamy |
| 6,610,360 B2 | 8/2003 | Petrmichl et al. |
| 6,632,762 B1 | 10/2003 | Zaykoski et al. |
| 6,638,570 B2 | 10/2003 | Veerasamy |
| RE38,358 E | 12/2003 | Petrmichl |
| 6,663,753 B2 | 12/2003 | Veerasamy et al. |
| 6,669,871 B2 | 12/2003 | Kwon et al. |
| 6,686,050 B2 | 2/2004 | Lingle et al. |
| 6,689,475 B1 | 2/2004 | Lin |
| 6,713,178 B2 | 3/2004 | Veerasamy |
| 6,713,179 B2 | 3/2004 | Veerasamy |
| 6,716,532 B2 | 4/2004 | Neuman et al. |
| 6,723,211 B2 | 4/2004 | Lingle et al. |
| 6,756,119 B1 | 6/2004 | Clough |
| 6,768,581 B1 * | 7/2004 | Yip et al. .................... 359/580 |
| 6,793,979 B2 | 9/2004 | Veerasamy |
| 2001/0044030 A1 | 11/2001 | Veerasamy et al. |
| 2003/0143401 A1 * | 7/2003 | Hukari et al. ............... 428/408 |
| 2003/0194616 A1 | 10/2003 | Carcia et al. |
| 2004/0072016 A1 | 4/2004 | Okazaki et al. |
| 2005/0178652 A1 | 8/2005 | Murphy et al. |

FOREIGN PATENT DOCUMENTS

| | | |
|---|---|---|
| GB | 1 598 924 | 9/1981 |
| JP | 8-104546 | 4/1996 |
| JP | 11-084624 | 3/1999 |
| WO | WO 2005/115941 | 12/2005 |

OTHER PUBLICATIONS

U.S. Appl. No. 60/529,103, filed Dec. 15, 2003.

* cited by examiner

Example 1A

SP_00025 after 60 minutes exposure at 50x.

SP_00025 after 24 hours exposure at 50x.

350 nm     ≈245 nm     180 nm

SP_00026 after 60 minutes exposure at 50x.

350 nm | ≈245 nm | 180 nm

Example 2

SP_00024 after 60 minute exposure at 50x.

SP_00024 after 24 hour exposure at 50x.

SCRATCH RESISTANT COATED GLASS ARTICLE RESISTANT FLUORIDE-BASED ETCHANT(S)

This application claims priority on U.S. Provisional Patent Application Nos. 60/529,624, filed Dec. 16, 2003, and 60/529,103, filed Dec. 15, 2003, the entire disclosures of which are hereby incorporated herein by reference.

This application relates to a coated article including a coating supported by a glass substrate. The coating includes an anti-etch layer that is resistant to fluoride-based etchant(s), and may also include other layer(s) such as a scratch-resistant layer comprising diamond-like carbon (DLC).

BACKGROUND OF THE INVENTION

Unfortunately, vandals have increasingly been turning to glass etchants as a tool of choice for graffiti. For example, graffiti on glass windows of subway cars is commonplace. Vandals are forming such graffiti on windows of subway cars, buildings, trains, buses and other glass windows by using glass etchants which are capable of etching glass at locations where such etchants are applied.

Armor-etch is an example of a bifluoride salt (e.g., ammonia bifluoride or sodium bifluoride) based paste used for etching patterns on glass surfaces, and has been used in forming graffiti. The mechanism of fluoride ion attack on $SiO_2$ of glass is summarized below for purposes of example only and understanding.

Though hydrogen fluoride (HF) does not dissociate well, active hydrogen fluoride paste reacts with silicate (which forms the matrix for glass) in the presence of water as in the following equations:

$$HF_2^- = HF + F^-$$

$$6HF + SiO_2 = H_2SiF_6 + 2H_2O$$

An alternative type of glass etching material, which is also a bifluoride based etchant, is sometimes referred to as B&B etching creme manufactured by B&B Etching Products. Ammonium bifluoride ($(NH_4)HF_2$) and sodium bifluoride ($NaHF_2$) salts are very soluble in water. For example, a 2.8 g/100 g solution of ammonium fluoride would produce a 1.7 g/100 g solution of hydrofluoric acid (HF) at pH 1, with 85% of the fluorine atoms in the form of HF. At higher concentrations or higher pH, a significant amount of the $HF_2^-$ ion is present. Acidified fluorides can produce substantial quantities of HF in solution.

The active ammonia bi-fluoride reacts with silicate in the presence of water as presented in the following equations:

$$(NH_4)HF_2 = (NH_4)^+ + HF_2^-$$

$$HF_2^- = HF + F^-$$

$$6HF + SiO_2 = H_2SiF_6 + 2H_2O$$

An equilibrium is established between the reactants and products. Thus, as hydrogen fluoride is consumed in reacting with the $SiO_2$ of the glass, more hydrogen fluoride is produced to maintain the equilibrium. The $SiO_2$ etch rate (i.e., the etch rate of the glass) is linearly related to the $HF^-$ and $HF_2^-$ concentrations, and is not related to the $F^-$ concentration at any pH.

Conventional coatings used for fluoride resistance to protect glass from such etchings are polymer-based film. Unfortunately, these coatings are susceptible to damage and are not scratch resistant thereby rendering their use in environments such as subway cars, buses and vehicles undesirable. Moreover, in some cases the film can be lifted and the etchant applied under the film.

Scratch resistant coated glass articles are known which utilize a layer(s) comprising diamond-like carbon (DLC) on the glass surface. For example, see U.S. Pat. Nos. 6,261,693, 6,303,226, 6,227,480, 6,280,834, 6,284,377, 6,447,891, 6,461,731, 6,395,333, 6,335,086, and 6,592,992, the disclosures of which are all hereby incorporated herein by reference. While carbon is resistant to fluoride ion (and $HF_2^-$) attack, these layers when formed via ion beam deposition techniques at very small thicknesses give rise to micro-particulates on the substrate. When such layers are very thin in nature, these micro-particles may give rise to pinholes which are pathways for the HF to attack the underlying glass. Thus, scratch resistant coated articles which utilize only a layer comprising DLC on the glass are sometimes susceptible to the fluoride based etchant attacks described above.

In view of the above, it can be seen that there exists a need in the art for a scratch resistant coated article which is also resistant to attacks by fluoride-based etchant(s).

BRIEF SUMMARY OF EXAMPLES OF THE INVENTION

A scratch resistant coated article is provided which is also resistant to attacks by at least some fluoride-based etchant(s) for at least a period of time. In certain example embodiments, an anti-etch layer(s) is provided on the glass substrate in order to protect the glass substrate from attacks by fluoride-based etchant(s). In certain example embodiments, the anti-etch layer(s) is substantially transparent to visible light.

In certain example embodiments, the anti-etch layer may be provided on the glass substrate, along with an overlying scratch resistant layer of or including diamond-like carbon (DLC).

In certain example embodiments, an underlayer(s) may be provided under the anti-etch layer(s).

In certain example embodiments, the anti-etch layer(s) may comprise or consist essentially of indium oxide and/or cerium oxide. In certain example embodiments, the optional underlayer(s) may comprise or consist essentially of silicon oxide or the like.

In certain example embodiments, there is provided a coated article comprising: a glass substrate; an anti-etch layer comprising indium oxide and/or cerium oxide supported by the glass substrate, wherein the anti-etch layer is resistant to at least some fluoride-based glass etchants; and a layer comprising diamond-like carbon (DLC) provided on the glass substrate over at least the anti-etch layer comprising indium oxide and/or cerium oxide.

In other example embodiments of this invention, there is provided a coated article comprising: a glass substrate; an anti-etch layer supported by the glass substrate, wherein the anti-etch layer is resistant to at least some fluoride-based glass etchants.

In still further example embodiments of this invention, there is provided a method of making a coated article, the method comprising: providing a glass substrate; at a temperature of at least about 200 degrees C., forming an anti-etch layer comprising indium oxide and/or cerium oxide on the glass substrate, wherein the anti-etch layer is resistant to at least some fluoride-based glass etchants; and using at least one ion beam, forming a layer comprising diamond-like carbon (DLC) on the glass substrate over at least the anti-etch layer.

DETAILED DESCRIPTION OF EXAMPLE EMBODIMENTS OF THE INVENTION

Figure 1:
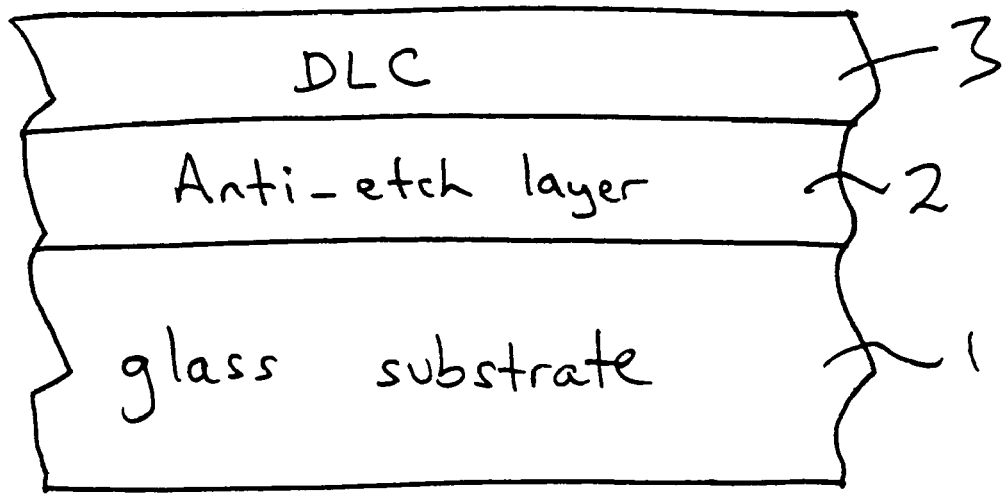
FIG. 1 is a cross sectional view of a coated article according to an example embodiment of this invention.

Referring now more particularly to the accompanying drawings in which like reference numerals indicate like parts/layers throughout the several views.

Coated articles according to certain example embodiments of this invention may be used as subway car windows, transit bus windows, train windows, or other types of vehicle windows, or the like in different applications. Coated articles according to certain example embodiments of this invention may also be used as architectural windows, in monolithic or IG unit form.

A scratch resistant coated article is provided which is also resistant to attacks by fluoride-based etchant(s). In certain example embodiments, an anti-etch layer(s) is provided on the glass substrate in order to protect the glass substrate from attacks by fluoride-based etchant(s). In certain example embodiments, the anti-etch layer(s) is substantially transparent to visible light (i.e., the anti-etch layer if deposited alone would be transmissive to at least about 80% of visible light, more preferably at least 80% of visible light).

In certain example embodiments of this invention, single or multi-layer coatings according to example embodiments of this invention are able to resist HF attack on glass for twenty-four hours or so with no visible sign of significant adverse effect. In example embodiments of this invention, such coatings have a dense structure, are characterized by ultra-low pinhole density, and/or are characterized by substantial chemical inertness (e.g., forming insoluble fluorides).

In certain example embodiments, the thickness of the anti-etch layer (see any layer 2 or 2' herein) need not exceed about 0.9 μm (or 9,000 Å). In certain example embodiments, the thickness of the anti-etch layer may be from about 50 to 9,000 Å, more preferably from 100-5,000 Å. In certain preferred instances, the anti-etch layer (2 or 2') is preferably at least about 2,500 Å thick, and still more preferably from about 3,000 to 5,000 Å thick. When the anti-etch layer is thinner than this, the etch resistance suffers undesirably, whereas when the anti-etch layer thickness is greater than this optical properties suffer. However, it is possible for the anti-etch layer to be thicker (e.g., from 9,000 to 20,000 Å) in certain instances.

FIG. 1 is a cross sectional view of a coated article according to an example embodiment of this invention. The coated article includes a glass substrate 1 (e.g., soda lime silica glass, or borosilicate glass which may or may not be polished) which supports both an anti-etch layer 2 and a scratch resistant layer 3 of or including DLC.

The layer 3 of or including DLC may be any of the DLC inclusive layers described in one or more of U.S. Pat. Nos. 6,261,693, 6,303,226, 6,227,480, 6,280,834, 6,284,377, 6,447,891, 6,461,731, 6,395,333, 6,335,086, and/or 6,592,992, the disclosures of which are all incorporated herein by reference. For example, and without limitation, DLC inclusive layer 3 may be from about 5 to 1,000 angstroms (Å) thick in certain example embodiments of this invention, more preferably from 10-300 Å thick. In certain example embodiments of this invention, layer 3 including DLC may have an average hardness of at least about 10 GPa, more preferably at least about 20 GPa, and most preferably from about 20-90 GPa. Such hardness renders layer (s) 3 resistant to scratching, certain solvents, and/or the like. Layer 3 may, in certain example embodiments, be of or include a special type of DLC known as highly tetrahedral amorphous carbon (t-aC), and may be hydrogenated (t-aC:H) in certain embodiments (e.g., from 5 to 39% hydrogen, more preferably from 5 to 25% hydrogen, and most preferably from 5 to 20% hydrogen). This type of DLC includes more $sp^3$ carbon-carbon (C—C) bonds than $sp^2$ carbon-carbon (C—C) bonds. In certain example embodiments, at least about 50% of the carbon-carbon bonds in the layer 3 may be $sp^3$ carbon-carbon (C—C) bonds, more preferably at least about 60% of the carbon-carbon bonds in the layer 3 may be $sp^3$ carbon-carbon (C—C) bonds, and most preferably at least about 70% of the carbon-carbon bonds in the layer 3 may be $sp^3$ carbon-carbon (C—C) bonds. In certain example embodiments of this invention, the DLC inclusive layer 3 may have a density of at least about 2.4 $gm/cm^3$, more preferably of at least about 2.7 $gm/cm^3$. Example linear ion beam sources that may be used to deposit DLC inclusive layer 3 on substrate 1 via an ion beam include any of those in any of U.S. Pat. No. 6,261,693, 6,002,208, 6,335,086, or 6,303,225 (all incorporated herein by reference). When using an ion beam source to deposit layer(s) 3, hydrocarbon feedstock gas(es) (e.g., $C_2H_2$), HMDSO, or any other suitable gas, may be used in the ion beam source in order to cause the source to emit an ion beam toward substrate 1 for forming DLC inclusive layer(s) 3. It is noted that the hardness and/or density of layer(s) 3 may be adjusted by varying the ion energy of the depositing apparatus. The use of DLC inclusive layer 3 allows the coated article (e.g., monolithic window, or IG unit) to be more scratch resistant than if the coating were not provided.

Anti-etch layer(s) 2 is provided to allow the coated article to be resistant to attacks by fluoride-based etchant(s) such as those discussed above. The anti-etch layer 2 may be deposited by sputtering, ion beam deposition, or ion beam assist deposition in different embodiments of this invention. Anti-etch layer 2 substantially prevents fluoride-based etchant(s) such as those discussed above from reaching the glass substrate 1 for a period of time (e.g., for at least one hour, more preferably for at least twelve hours, and most preferably for at least twenty-four hours), thereby rendering the coated article more resistant to attacks by fluoride-based etchant(s) such as those discussed above. Moreover, since certain embodiments of this invention are used in the context of window applications, the anti-etch layer(s) 2 is substantially transparent to visible light (i.e., the anti-etch layer if deposited alone would be transmissive to at least about 90% of visible light).

The anti-etch layer 2 (or 2') may be made of or comprise one or more of the following materials in certain embodiments of this invention. Example materials, resistant to attacks by fluoride-based etchant(s), which may be used for layer 2 include: nitrides of Al, Si, Nb, Cr and/or Ni, oxides of Al, Si, Ge, Mg, Nb, Mn, V, W, Hf, Ce, and/or Sn, carbides of Si and/or W, fluorides of Mg, Ba and/or Ca, borides of Zr, Ni, Co and/or Fe, oxides of Mo, In, Ta, Ni, Nb, Cu, MoIn, MoTa, and/or NiCu, and oxynitrides of Mo, In, Ta, Ni, Nb, Cu, MoIn, MoTa, and/or NiCu. Other possible materials for any anti-etch layer 2 (or 2') herein include zirconium oxycarbide ($ZrO_xC_y$), tin oxycarbide ($SnO_xC_y$), zirconium nitride carbide ($ZrN_xC_y$), and/or tin nitride carbide ($Sn_xNC_y$).

Figure 2:
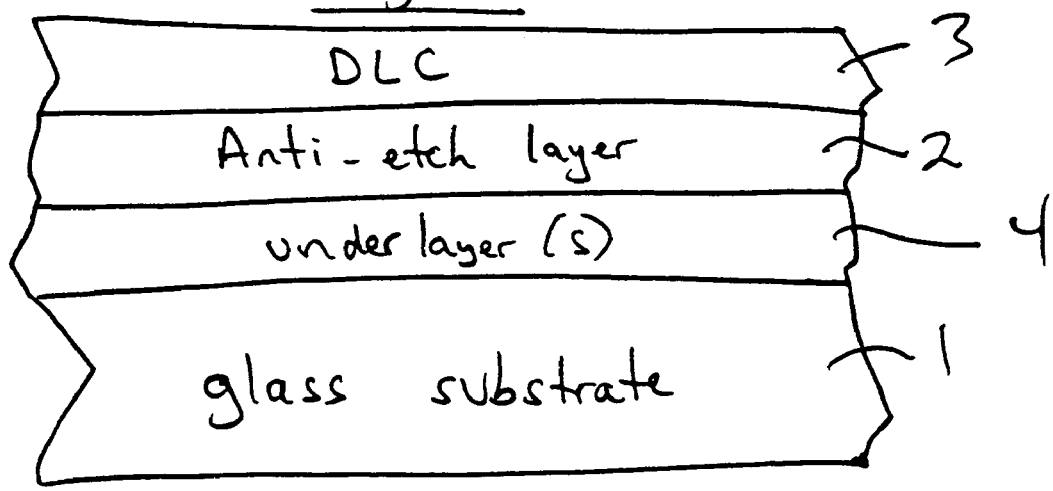
FIG. 2 is a cross sectional view of a coated article according to another example embodiment of this invention.

FIG. 2 illustrates another example embodiment of this invention where an underlayer 4 (e.g., silicon nitride, silicon oxide {e.g., $SiO_2$ or any other suitable stoichiometry}, or silicon oxynitride) is provided between the glass substrate 1 and the anti-etch layer 2.

Figure 3:
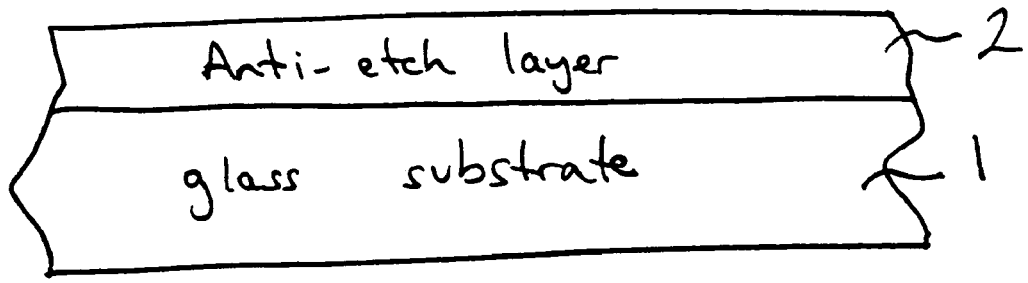
FIG. 3 is a cross sectional view of a coated article according to another example embodiment of this invention.

FIG. 3 illustrates another example embodiment of this invention where the anti-etch layer 2 alone is provided on the glass substrate. There need not be any protective layer over the anti-etch layer 2 in this embodiment.

The anti-etch layer 2 in the FIG. 2-3 embodiments may be made of or include the materials listed above with respect to layer 2.

Figure 4:
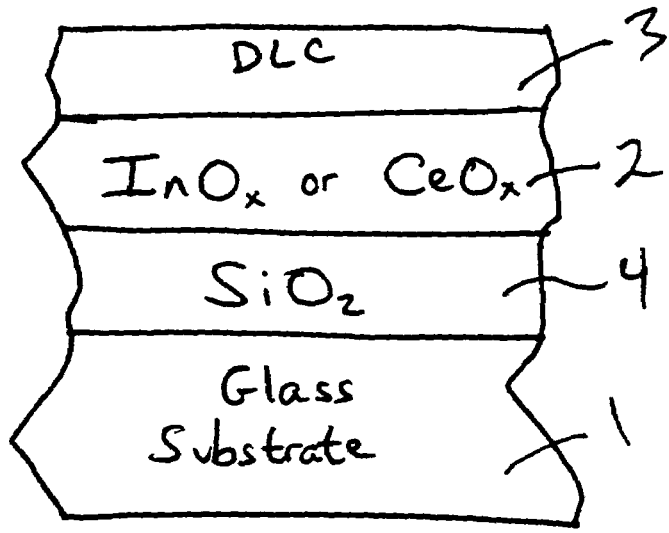
FIG. 4 is a cross sectional view of a coated article according to another example embodiment of this invention.

FIG. 4 illustrates a particular example embodiment of this invention. In the FIG. 4 embodiment, the glass substrate 1 may be either float glass (i.e., soda lime silica based glass) or borosilicate glass (which may or may not be polished in different instances). On glass substrate 1 in the FIG. 4 embodiment are underlayer 4 of or including silicon oxide (e.g., $SiO_x$ where x is from 1.5 to 2.5, more preferably about 2.0), anti-etch layer 2 of or including indium oxide (e.g., $InO_x$ where x is from about 1.0 to 3.0, more preferably from about 1.5 to 2.5, and possibly about 2.0) and/or cerium oxide ($CeO_x$ where x may be from about 0.75 to 2.5), and optionally protective overcoat 3 of or including DLC. In certain example instances of the FIG. 4 embodiment, the anti-etch layer 2 may be of or comprise tantalum oxide ($Ta_xO_y$) where x may be about 2 and y from about 3 to 5, preferably about 5. As will be explained below, it has surprisingly been found that the provision of underlayer 4 unexpectedly and significantly improves the etch resistance of layer 2 in certain example embodiments of this invention. In particular, it has surprisingly been found that the use of silicon oxide as an underlayer in combination with the use of cerium oxide and/or indium oxide as an anti-etch layer significantly improves etch-resistance properties of the coated article.

It is believed that the underlayer 4 of silicon oxide removes or reduces chemical defects on the surface on which the anti-etch layer is directly provided. Such defects may lead to growth defects in the anti-etch layer 2 which can be weak points more susceptible to etchant attack. Thus, the removal or reduction of such defects via the use of silicon oxide is advantageous in that etch resistance can be surprisingly improved. The silicon oxide of the underlayer 4 may be formed in any suitable manner, such as by magnetron sputtering, flame pyrolysis (combustion-CVD). An example advantage of combustion-CVD is that it is an atmospheric pressure process and does not require expensive hardware typically associated with low pressure processes such as sputtering.

In the FIG. 4 embodiment (see FIG. 5 embodiment also), it is preferred in certain example instances that the anti-etch layer 2 is at least two times as thick as the underlayer 4, more preferably at least five times as thick, even more preferably at least eight times as thick, and most preferably at least ten times as thick as the underlayer 4. In a similar manner, it is preferred in certain example instances that the anti-etch layer 2 is at least two times as thick as the DLC layer 3, more preferably at least five times as thick, even more preferably at least eight times as thick, and most preferably at least ten times as thick as the DLC layer 3.

Figure 5:
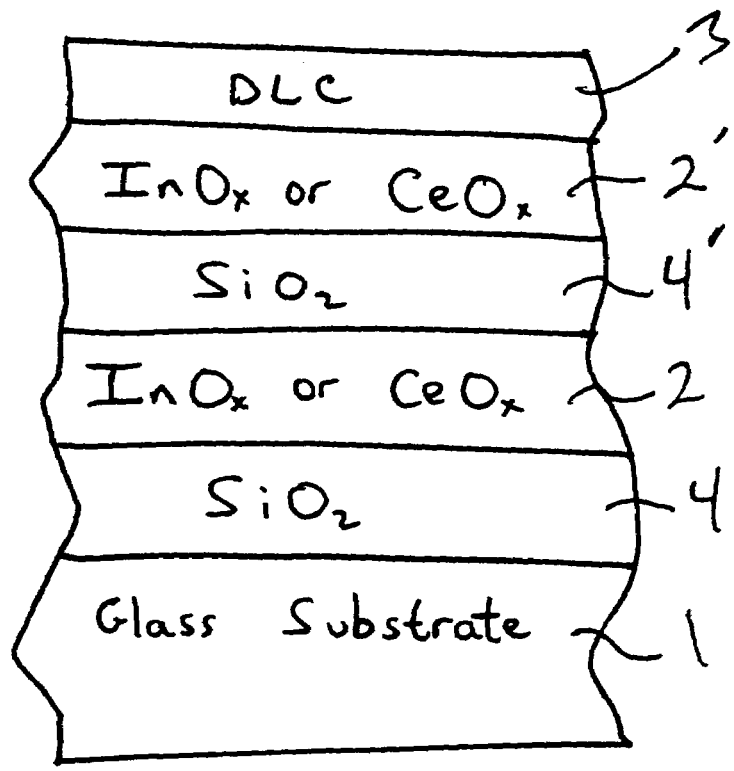
FIG. 5 is a cross sectional view of a coated article according to another example embodiment of this invention.

FIG. 5 illustrates another example embodiment of this invention, where multiple anti-etch layers (2 and 2') are present as are multiple underlayers (4 and 4'). In the FIG. 5 embodiment, the glass substrate 1 may be either float glass (i.e., soda lime silica based glass) or borosilicate glass (which may or may not be polished in different instances). On glass substrate 1 in the FIG. 5 embodiment are underlayer 4 of or including silicon oxide (e.g., $SiO_x$ where x is from 1.5 to 2.5, more preferably about 2.0), bottom anti-etch layer 2 of or including indium oxide (e.g., $InO_x$ where x is from about 1.0 to 3.0, more preferably from about 1.5 to 2.5, and possibly about 2.0) and/or cerium oxide ($CeO_x$ where x may be from about 0.75 to 2.5), upper underlayer 4' of or including silicon oxide (e.g., $SiO_x$ where x is from 1.5 to 2.5, more preferably about 2.0), top anti-etch layer 2' of or including indium oxide (e.g., $InO_x$ where x is from about 1.0 to 3.0, more preferably from about 1.5 to 2.5, and possibly about 2.0) and/or cerium oxide ($CeO_x$ where x may be from about 0.75 to 2.5), and optionally protective overcoat 3 of or including DLC as discussed above. In certain example instances of the FIG. 5 embodiment, one or both of the anti-etch layers may be of or comprise tantalum oxide ($Ta_xO_y$) where x may be about 2 and y from about 3 to 5, preferably about 5. The provision of underlayers 4 and 4' unexpectedly and significantly improves the etch resistance of layers 2 and 2' in certain example embodiments of this invention. Moreover, the presence of multiple anti-etch layers 2 improves the etch resistance of the coated article.

In certain example embodiments of this invention, any of the aforesaid embodiments may include a coated article having a visible transmission of from about 10 to 90%, more preferably from about 30 to 85%, and most preferably from about 50 to 80%.

In certain example embodiments of this invention, any of the aforesaid underlayers (e.g., 4 or 4' of or including $SiO_x$ or the like) may have a thickness of from 30 to 800 Å, more preferably from about 50 to 500 Å, and most preferably from about 100 to 400 Å.

It has been found that the deposition temperature for the anti-etch layer 2 (or 2') may in certain instances play a role in etch resistance. In certain example instances, depositing anti-etch layer 2 at elevated temperatures results in unexpectedly improved etch resistance. In certain example embodiments, the anti-etch layer (2 and/or 2') is deposited onto a glass substrate 1 (with or without an underlayer(s) 4 therebetween) at a temperature of at least 100 degrees C., more preferably of at least 200 degrees C., still more preferably at least 300 degrees C., even more preferably of at least 400 degrees C., and sometimes at least 450 degrees C. However, in other example instances, elevated temperatures are not used and the deposition may take place at room temperature or the like.

EXAMPLES

The following examples are provided for purposes of example only and are not intended to be limiting unless expressly claimed.

A comparison between Examples 1A and 1B illustrates the unexpected advantages associated with providing a underlayer of silicon dioxide under the anti-etch layer.

Figure 6:
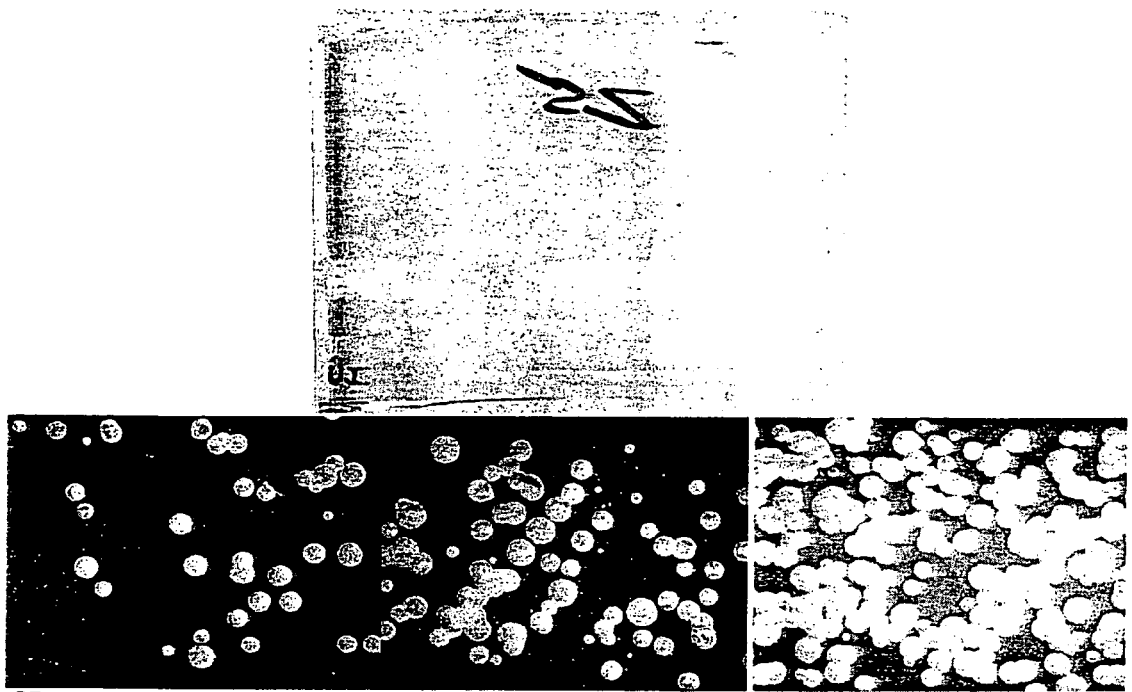
FIGS. 6 through 8 are photographs illustrating etch resistance of certain examples of the instant invention.
Figure 6:
Figure 6:
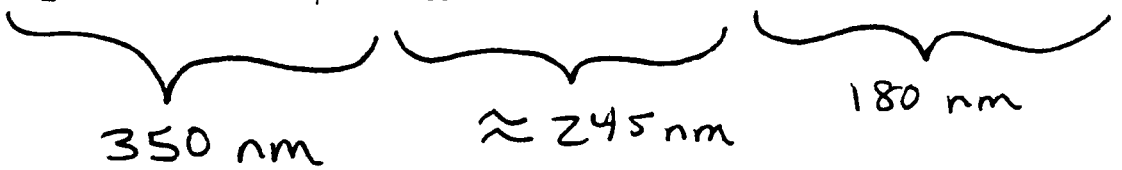

In Example 1A, a float glass (i.e., soda lime silica based glass) substrate 1 about 6 mm thick was provided, and a layer of indium oxide was sputtered directly onto the surface of the glass substrate with no layer therebetween (e.g., see FIG. 3). The glass substrate was at a temperature of about 550 degrees C. during the formation of the indium oxide layer in Example 1A. The indium oxide layer was formed so as to have a varying thickness across the width of the glass substrate. In particular, the indium oxide layer in Example 1A had a thickness which changed (approximately linearly) from a thickest portion 3500 Å (350 nm) thick at the left side of the article to a thinnest portion 1800 Å (180 nm) thick at the right side of the article (this was done to illustrate the effect of thickness of the indium oxide layer on etch resistance). After the indium oxide layer was formed on the glass substrate (no other layer was present), different portions of the sample were exposed to Armour Etch (hydrogen fluoride based paste used for etching patterns on glass surfaces discussed above) for 60 minutes and 24 hours respectively, and thereafter the residual etchant was removed and the sample portions blown dry and the pictures of FIG. 6 were taken. In FIG. 6, the upper row of three pictures shows the post-etch results at areas having respective thicknesses of 350 nm, 245 nm and 180 nm moving left to right after 60 minutes of exposure, and the lower row of three pictures shows the post-etch results at areas having respective thicknesses of 350 nm, 245 nm and 180 nm moving left to right after 24 hours of exposure. It can be seen that in no case was the coating entirely destroyed, but that thicker layer portions were more resistant to the etchant.

Figure 7:
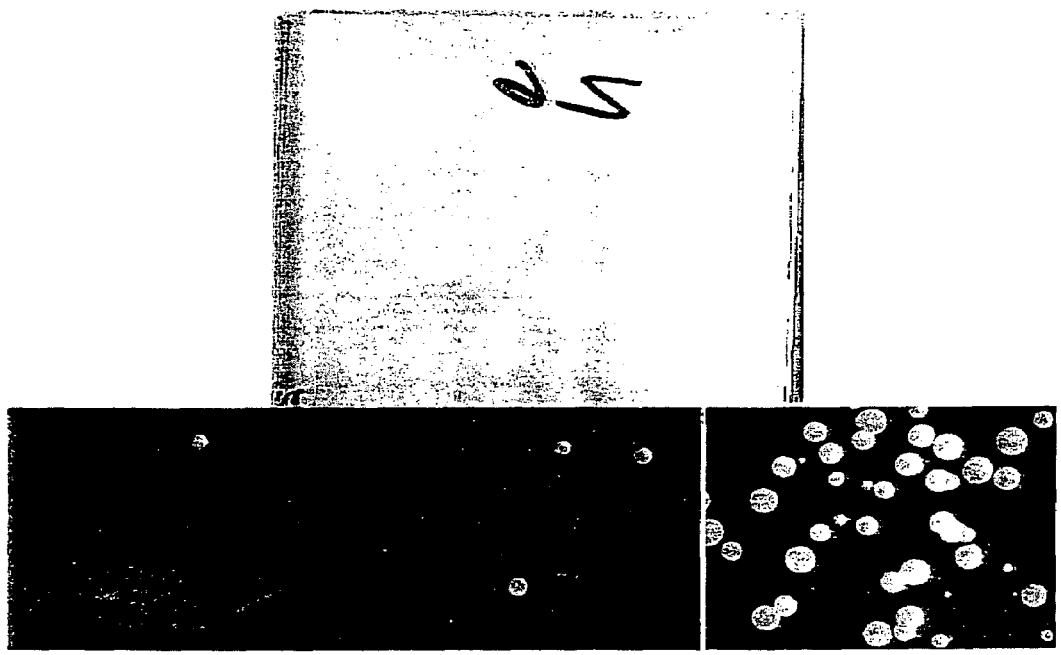
Figure 7:
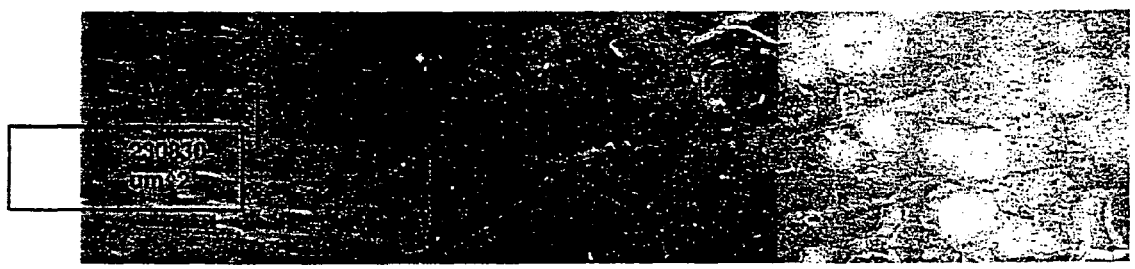

Example 1B was the same as Example 1A, except that in Example 1B a 200 Å thick underlayer 4 of SiO$_2$ was provided between the glass substrate 1 and the indium oxide anti-etch layer 2 (e.g., see FIG. 4 absent layer 3). Also, the substrate was about 10 mm thick in Example 1B. Otherwise, Examples 1A and 1B were the same. FIG. 7 illustrates photos taken of the Example 1B sample. In FIG. 7, the upper row of three pictures shows the post-etch results at areas having respective thicknesses of 350 nm, 245 nm and 180 nm moving left to right after 60 minutes of exposure, and the lower row of three pictures shows the post-etch results at areas having respective thicknesses of 350 nm, 245 nm and 180 nm moving left to right after 24 hours of exposure. By comparing FIGS. 6 and 7, it can be seen that the provision of the silicon oxide underlayer in Example 1B resulted in significantly improved etch resistance compared to Example 1A (i.e., FIG. 7 illustrates better etch resistance than does FIG. 6).

Figure 8:
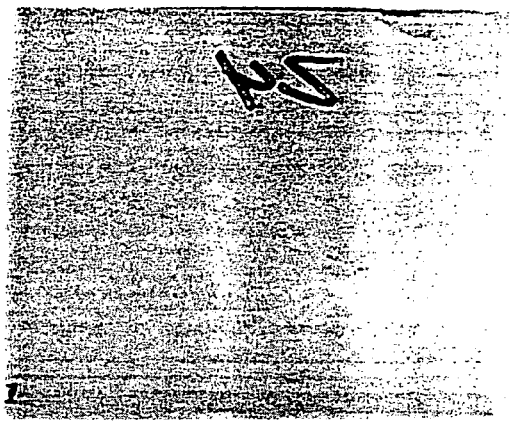
Figure 8:
Figure 8:
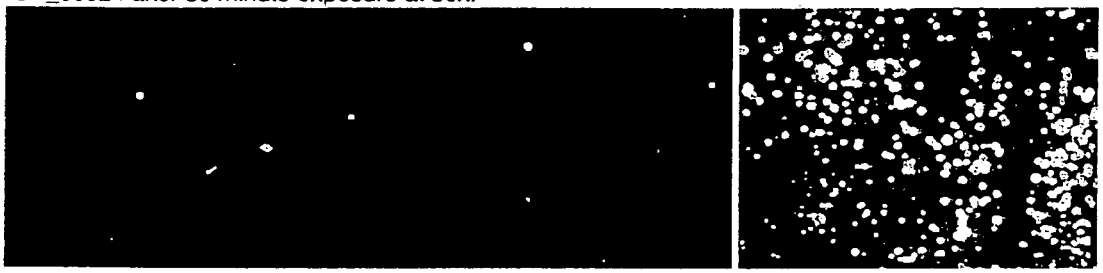

In Example 2, a polished borosilicate glass substrate 1 about 1 mm thick was provided, and a layer of indium oxide was sputtered directly onto the surface of the borosilicate glass substrate with no layer therebetween (e.g., see FIG. 3). The glass substrate was at a temperature of about 550 degrees C. during the formation of the indium oxide layer in Example 2. As in the other examples, the indium oxide layer was formed so as to have a varying thickness across the width of the glass substrate. In particular, the indium oxide layer in Example 2 had a thickness which changed (approximately linearly) from a thickest portion 3500 Å (350 nm) thick at the left side of the article to a thinnest portion 1800 Å (180 nm) thick at the right side of the article (this was done to illustrate the effect of thickness of the indium oxide layer on etch resistance). After the indium oxide layer was formed on the glass substrate (no other layer was present), different portions of the sample were exposed to Armour Etch (hydrogen fluoride based paste used for etching patterns on glass surfaces discussed above) for 60 minutes and 24 hours respectively, and thereafter the residual etchant was removed and the sample portions blown dry and the pictures of FIG. 8 were taken. In FIG. 8, the upper row of three pictures shows the post-etch results at areas having respective thicknesses of 350 nm, 245 nm and 180 nm moving left to right after 60 minutes of exposure, and the lower row of three pictures shows the post-etch results at areas having respective thicknesses of 350 nm, 245 nm and 180 nm moving left to right after 24 hours of exposure. It can be seen that excellent etch resistance was achieved in Example 2.

In Example 3, a layer of cerium oxide was sputtered directly onto the surface of a 1 mm thick borosilicate glass substrate with no layer therebetween at room temperature (e.g., see FIG. 3). The cerium oxide layer in Example 3 had a thickness which changed (approximately linearly) from a thickest portion 3500 Å (350 nm) thick to a thinnest portion 1500 Å (150 nm) thick. After the cerium oxide layer was formed on the glass substrate (no other layer was present), different portions of the sample were exposed to Armour Etch (hydrogen fluoride based paste used for etching patterns on glass surfaces discussed above) for 60 minutes and 24 hours respectively, and processed as in Examples 1-2. Good anti-etch properties were achieved in the areas where the thick portion of the cerium oxide coating was provided, after both 60 minutes and 24 hours of exposure. Thus, it can be seen that cerium oxide is capable of functioning as a good anti-etch material whether deposited at elevated temperatures or at room temperature as in this example.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is :

1. A window on a subway car, train or bus, the window on the subway car, train or bus including a coated article comprising:
    a glass substrate;
    an anti-etch layer comprising indium oxide directly on and contacting the glass substrate, wherein the anti-etch layer is resistant to at least some fluoride-based glass etchants; and
    a layer comprising diamond-like carbon (DLC) provided on the glass substrate over and directly contacting the anti-etch layer comprising indium oxide, so that the window on the subway car, train or bus comprises the layer comprising DLC over and contacting the anti-etch layer comprising indium oxide in order to reduce effects of graffiti on the window of the subway car, train or bus.

2. The window on the subway car, train or bus of claim 1, wherein the coated article has a visible transmission of from about 10 to 90%.

3. The window on the subway car, train or bus of claim 1, wherein the anti-etch layer is at least about 2,500 Å thick.

4. The window on the subway car, train or bus of claim 3, wherein the anti-etch layer is from about 3,000 to 5,000 Å thick.

5. The window on the subway car, train or bus of claim 1, wherein the glass substrate comprises borosilicate glass.

6. The window on the subway car, train or bus of claim 1, wherein at least two of said anti-etch layers are provided on the glass substrate.

7. A window on a subway car, train or bus, the window including a coated article comprising:
    a glass substrate;
    an anti-etch layer comprising indium oxide and/or cerium oxide directly on and contacting the glass substrate, wherein the anti-etch layer is resistant to at least some fluoride-based glass etchants; and
    a layer comprising diamond-like carbon (DLC) provided on the glass substrate over and directly contacting the anti-etch layer, so that the window on the subway car, train or bus comprises the layer comprising DLC over and contacting the anti-etch layer in order to reduce effects of graffiti on the window.

8. The window on the subway car, train or bus of claim 7, wherein the coated article has a visible transmission of from about 10 to 90%.

9. The window on the subway car, train or bus of claim 7, wherein the anti-etch layer is at least about 2,500 Å thick.

10. A window on a subway car, train or bus, the window including a coated article comprising:
- a glass substrate;
- an anti-etch layer supported by the glass substrate, wherein the anti-etch layer is resistant to at least some fluoride-based glass etchants; and wherein the anti-etch layer comprises a fluoride of at least one of MoIn, MoTa, Nb, Ta, In, Ce, Zr and NiCu, so that the window on the subway car, train or bus comprises the anti-etch layer in order to reduce effects of graffiti on the window.

* * * * *